United States Patent
Suzuki (10) Patent No.: US 10,170,507 B2
(45) Date of Patent: Jan. 1, 2019

(54) SOLID-STATE IMAGING DEVICE

(71) Applicant: OLYMPUS CORPORATION, Tokyo (JP)

(72) Inventor: Shunsuke Suzuki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/606,129

(22) Filed: May 26, 2017

(65) Prior Publication Data
US 2017/0263660 A1    Sep. 14, 2017

Related U.S. Application Data

(63) Continuation of application No. PCT/JP2015/050502, filed on Jan. 9, 2015.

(51) Int. Cl.
*H01L 31/0232* (2014.01)
*H01L 27/146* (2006.01)
(Continued)

(52) U.S. Cl.
CPC ........ *H01L 27/14605* (2013.01); *G02B 5/201* (2013.01); *G02B 27/1013* (2013.01);
(Continued)

(58) Field of Classification Search
CPC ........... H01L 27/14605; H01L 27/1463; H01L 27/14625; H01L 27/14636;
(Continued)

(56) References Cited

U.S. PATENT DOCUMENTS

| 4,410,804 A | 10/1983 | Stauffer | |
|---|---|---|---|
| 2011/0109776 A1* | 5/2011 | Kawai | H01L 27/14625 348/273 |
| 2015/0318322 A1* | 11/2015 | Borthakur | H01L 27/14634 348/294 |

FOREIGN PATENT DOCUMENTS

| JP | 58-24105 A | 2/1983 |
|---|---|---|
| JP | 2013-187475 A | 9/2013 |
| WO | 2014/097899 A1 | 6/2014 |

OTHER PUBLICATIONS

International Search Report dated Apr. 7, 2015, issued in counterpart International Application No. PCT/JP2015/050502.
(Continued)

*Primary Examiner* — Vu A Vu
(74) *Attorney, Agent, or Firm* — Westerman, Hattori, Daniels & Adrian, LLP (57) ABSTRACT

A solid-state imaging device has a plurality of micro lenses, a first substrate, and a second substrate. The first substrate has a plurality of first photoelectric conversion units. Each of the plurality of first photoelectric conversion units corresponds to any one of the plurality of micro lenses. The second substrate has a plurality of second photoelectric conversion units and a plurality of third photoelectric conversion units. A plurality of pairs of photoelectric conversion units are disposed, and each of the plurality of pairs of photoelectric conversion units includes one of the second photoelectric conversion units and one of the third photoelectric conversion units. Each of the plurality of pairs of photoelectric conversion units corresponds to at least one of the plurality of first photoelectric conversion units. The second substrate further includes charge isolation regions disposed between the second photoelectric conversion units and the third photoelectric conversion units.

5 Claims, 7 Drawing Sheets

(51) Int. Cl.
  *H04N 5/374*  (2011.01)
  *G02B 27/10*  (2006.01)
  *G02B 5/20*  (2006.01)
  *H04N 5/232*  (2006.01)

(52) U.S. Cl.
  CPC .... *H01L 27/1463* (2013.01); *H01L 27/14621* (2013.01); *H01L 27/14625* (2013.01); *H01L 27/14627* (2013.01); *H01L 27/14636* (2013.01); *H01L 27/14645* (2013.01); *H04N 5/374* (2013.01); *H04N 5/23212* (2013.01)

(58) Field of Classification Search
  CPC ......... H01L 27/14645; H01L 27/14621; H01L 27/14627; G02B 27/1013; G02B 5/201; H04N 5/374; H04N 5/23212
  USPC ........................................................ 257/342
  See application file for complete search history.

(56) References Cited

OTHER PUBLICATIONS

Office Action dated Oct. 2, 2018, issued in counterpart Japanese application No. 2016-568246, with English translation. (5 pages).

\* cited by examiner

SOLID-STATE IMAGING DEVICE

This application is a continuation application based on PCT International Patent Application No. PCT/JP2015/050502, filed on Jan. 9, 2015, the entire content of which is hereby incorporated herein by reference.

BACKGROUND OF THE INVENTION

Field of the Invention

The present invention relates to a solid-state imaging device having a structure in which a plurality of substrates are stacked.

Description of Related Art

Examples of an autofocus (AF) method include a method of using a phase difference AF sensor, that is, phase difference AF. Considering the conditions of a casing, mounting a phase difference AF sensor in a mirror-less single lens reflex (SLR) camera is more difficult than in a digital SLR camera in the related art. In view of this point, a solid-state imaging device including pixels for acquiring an image and pixels for phase difference AF in an effective pixel area has been provided.

However, since pixels for phase difference AF are present in an effective pixel area of the solid-state imaging device, pixels for acquiring an image are not present at such positions. Thus, the pixels at such positions are handled as defective pixels. In order to secure performance of an AF operation, a predetermined number of pixels for phase difference AF is necessary. For this reason, image data need supplementary defect processing at positions of many pixels for phase difference AF. As a result, it may be difficult to acquire sufficient image quality.

Japanese Unexamined Patent Application, First Publication No. 2013-187475 discloses a solid-state imaging device in which the above-described points are remedied. The solid-state imaging device disclosed in Japanese Unexamined Patent Application, First Publication No. 2013-187475 has a first substrate and a second substrate which are stacked. First photoelectric conversion units for acquiring an image are disposed on the first substrate and second photoelectric conversion units for phase difference AF are disposed on the second substrate.

Figure 7:
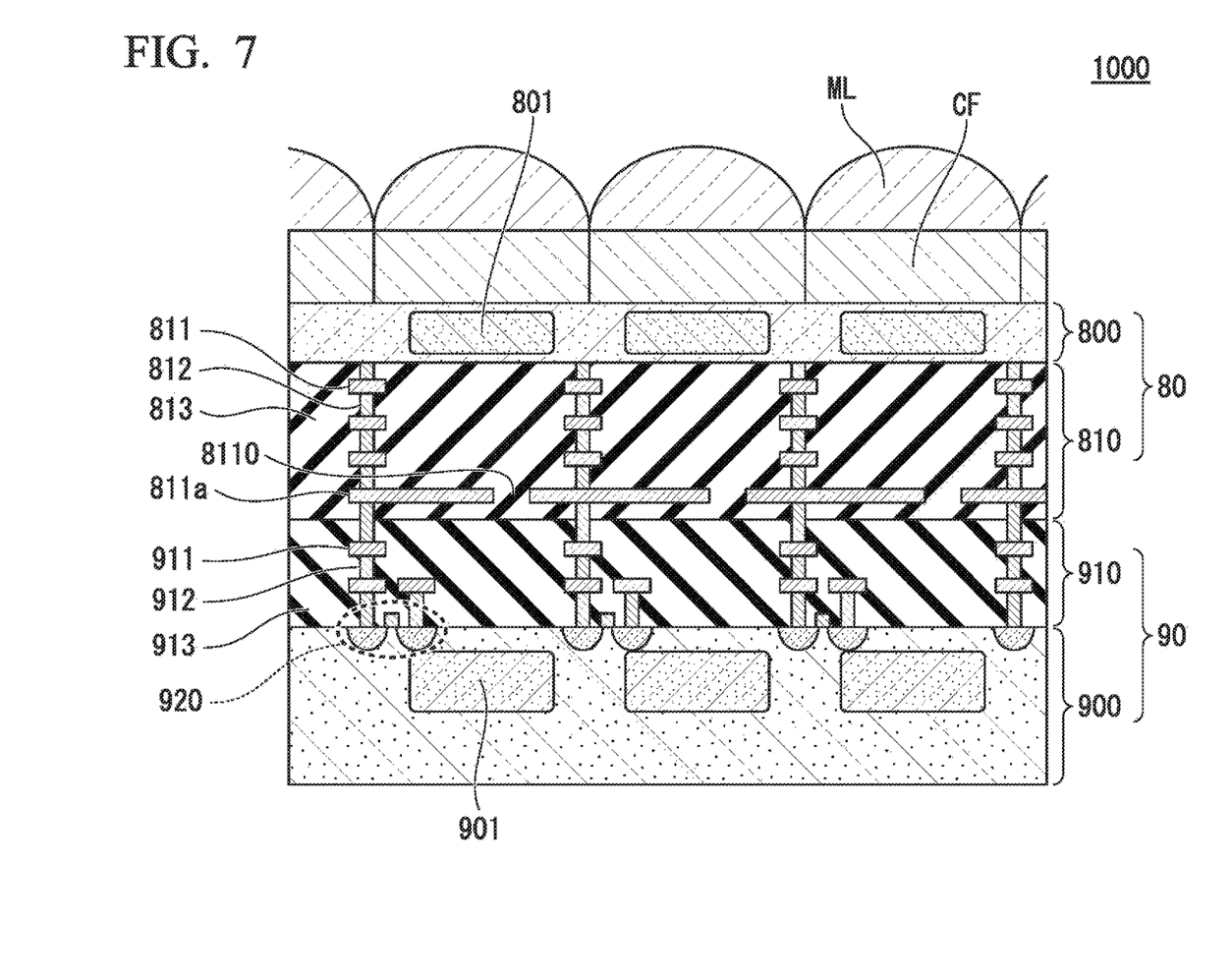
FIG. 7 is a cross-sectional view of a solid-state imaging device in the related art.

The solid-state imaging device disclosed in Japanese Unexamined Patent Application, First Publication No. 2013-187475 will be described in detail. FIG. 7 is a constitution of a solid-state imaging device 1000 disclosed in Japanese Unexamined Patent Application, First Publication No. 2013-187475. FIG. 7 shows a cross section of the solid-state imaging device 1000. As shown in FIG. 7, the solid-state imaging device 1000 has a first substrate 80, a second substrate 90, microlenses ML, and color filters CF. The first substrate 80 and the second substrate 90 are stacked.

The color filters CF are disposed on a main surface (the widest surface among a plurality of surfaces forming a surface of the substrate) of the first substrate 80 and the microlenses ML are disposed above the color filters CF. Although there are a plurality of micro lenses ML in FIG. 7, a reference sign of one of the microlenses ML is indicated as a representative thereof. Furthermore, although there are the plurality of color filters CF in FIG. 7, a reference sign of one of the color filters CF is indicated as a representative thereof.

Light from a subject passing through imaging lenses disposed optically forward of the solid-state imaging device 1000 is incident on the micro lenses ML. An image of the light transmitted through imaging lenses is formed through the micro lenses ML. The light with wavelengths corresponding to predetermined colors is transmitted through the color filters CF. For example, red, green, and blue color filters CF are disposed to form a Bayer array with a two-dimensional form.

The first substrate 80 has a first semiconductor layer 800 and a first wiring layer 810. The first semiconductor layer 800 has first photoelectric conversion units 801 configured to convert the incident light into signals.

The first wiring layer 810 has first wirings 811, first vias 812, and a first inter-layer insulating film 813. Although there are a plurality of first wirings 811 in FIG. 7, a reference sign of one of the first wirings 811 is indicated as a representative thereof. Furthermore, although there are a plurality of first vias 812 in FIG. 7, a reference sign of one of the first vias 812 is indicated as a representative thereof.

The first wirings 811 are thin films by which wiring patterns are formed. The first wirings 811 transfer signals generated by the first photoelectric conversion units 801 and other signals (a power supply voltage, a ground voltage, and the like). In an example shown in FIG. 7, four-layer first wirings 811 are formed. The first wirings 811 formed as a fourth layer closest to the second substrate 90 function as light shielding layers 811a.

Openings 8110 through which only a part of light incident on the first substrate 80 passes are formed between the light shielding layers 811a. The openings 8110 are defined by lateral walls of the light shielding layers 811a.

The first vias 812 connect the first wirings 811 of different layers. Portions of the first wiring layer 810 other than the first wirings 811 and the first vias 812 are formed of the first inter-layer insulating film 813.

The second substrate 90 has a second semiconductor layer 900 and a second wiring layer 910. The second semiconductor layer 900 has second photoelectric conversion units 901 configured to convert the incident light into signals.

The second wiring layer 910 has second wirings 911, second vias 912, a second inter-layer insulating film 913, and MOS transistors 920. Although there are a plurality of second wirings 911 in FIG. 7, a reference sign of one of the second wirings 911 is indicated as a representative thereof. Furthermore, although there are a plurality of second vias 912 in FIG. 7, a reference sign of one of the second vias 912 is indicated as a representative thereof. Although there are a plurality of MOS transistors 920 in FIG. 7, a reference sign of one of the MOS transistors 920 is indicated as a representative thereof.

The second wirings 911 are thin films by which wiring patterns are formed. The second wirings 911 transfer signals generated by the second photoelectric conversion units 901 and other signals (a power supply voltage, a ground voltage, and the like). In the example shown in FIG. 7, two-layer second wirings 911 are formed.

The second vias 912 connect the second wirings 911 of different layers. Portions of the second wiring layer 910 other than the second wirings 911 and the second vias 912 are formed of the second inter-layer insulating film 913.

Each of the MOS transistors 920 has a source region, a drain region, and a gate electrode. The source region and the drain region are diffusion regions formed in the second semiconductor layer 900. The gate electrode is disposed in the second wiring layer 910. The source regions and the drain regions are connected to the second vias 912. The gate electrode is disposed between the source region and the drain region. The MOS transistors 920 process signals transferred through the second wirings 911 and the second vias 912.

The first substrate 80 and the second substrate 90 are electrically connected at an interface between the first substrate 80 and the second substrate 90 via the first vias 812 and the second vias 912.

The solid-state imaging device 1000 shown in FIG. 7 can generate imaging signals from the signals generated by the first photoelectric conversion units 801. Furthermore, the solid-state imaging device 1000 shown in FIG. 7 can generate signals (signals for calculating a phase difference) used for focus detection using phase difference AF from the signals generated by the second photoelectric conversion units 901.

SUMMARY OF THE INVENTION

According to a first aspect of the present invention, a solid-state imaging device has a plurality of micro lenses, a first substrate, and a second substrate. The first substrate has a plurality of first photoelectric conversion units. Each of the plurality of first photoelectric conversion units corresponds to any one of the plurality of micro lenses. First light transmitted through the plurality of micro lenses is incident on the plurality of first photoelectric conversion units corresponding to the plurality of micro lenses. The plurality of first photoelectric conversion units generate first signals according to the first light. The second substrate has a plurality of second photoelectric conversion units and a plurality of third photoelectric conversion units. A plurality of pairs of photoelectric conversion units are disposed, and each of the plurality of pairs of photoelectric conversion units includes one of the second photoelectric conversion units and one of the third photoelectric conversion units. Each of the plurality of pairs of photoelectric conversion units corresponds to at least one of the plurality of first photoelectric conversion units. Second light transmitted through the plurality of first photoelectric conversion units is incident on the plurality of pairs of photoelectric conversion units corresponding to the plurality of first photoelectric conversion units. The plurality of second photoelectric conversion units generate second signals according to third light. The third light is the second light corresponding to light passing through a first lens region. The plurality of third photoelectric conversion units generate third signals according to fourth light. The fourth light is the second light corresponding to light passing through a second lens region. An imaging lens is disposed optically forward of the plurality of micro lenses. The imaging lens has the first lens region and the second lens region. The second substrate further includes charge isolation regions disposed between the second photoelectric conversion units and the third photoelectric conversion units. The charge isolation regions are configured to prevent movement of charge between the second photoelectric conversion units and the third photoelectric conversion units.

According to a second aspect of the present invention, in the first aspect, the first substrate may further have a wiring layer and separating layers. The wiring layer may have a plurality of wirings which are stacked. The separating layers may have some of the plurality of wirings and may be disposed such that the separating layers and the charge isolation regions overlap.

According to a third aspect of the present invention, in the first aspect, the plurality of pairs of photoelectric conversion units may be disposed in a matrix form. Two or more second signals generated by two or more second photoelectric conversion units disposed in a direction in an array of the plurality of pairs of photoelectric conversion units may be added. Two or more third signals generated by two or more third photoelectric conversion units disposed in the direction may be added.

According to a fourth aspect of the present invention, in the first aspect, each of the plurality of pairs of photoelectric conversion units may correspond to two or more first photoelectric conversion units. The second light transmitted through two or more first photoelectric conversion units may be incident on one of the second photoelectric conversion units and one of the third photoelectric conversion units included in a pair of photoelectric conversion units corresponding to the two or more first photoelectric conversion units.

DETAILED DESCRIPTION OF THE INVENTION

Embodiments of the present invention will be described with reference to the drawings.

(First Embodiment)

Figure 1:
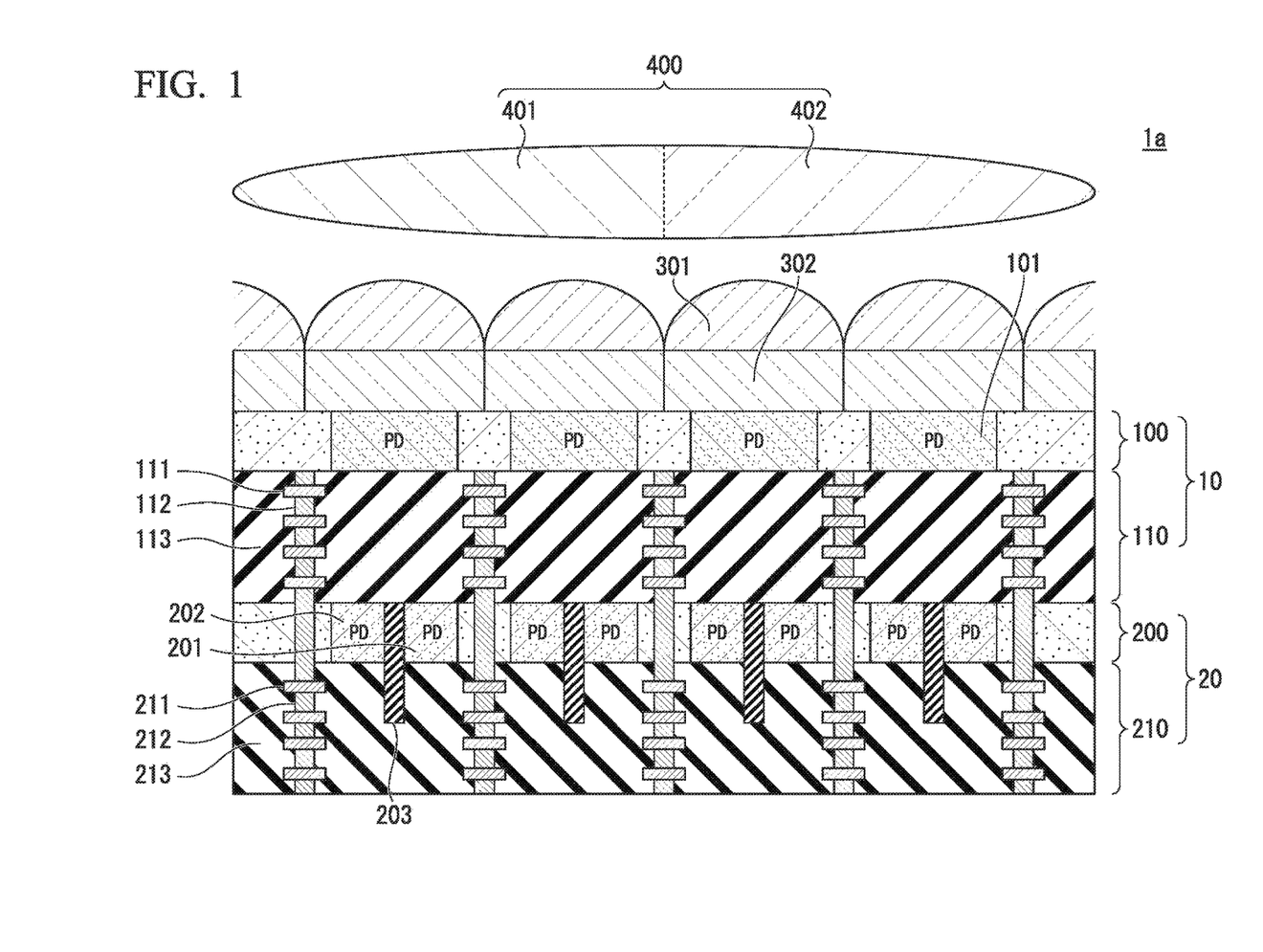
FIG. 1 is a cross-sectional view of a solid-state imaging device of a first embodiment of the present invention.

FIG. 1 shows a constitution of a solid-state imaging device 1a of a first embodiment of the present invention. FIG. 1 shows a cross section of the solid-state imaging device 1a. As shown in FIG. 1, the solid-state imaging device 1a has a first substrate 10, a second substrate 20, micro lenses 301, color filters 302, and an imaging lens 400. The first substrate 10 and the second substrate 20 are stacked.

Dimensions of a portion forming the solid-state imaging device 1a are not in accordance with dimensions shown in FIG. 1. The dimensions of a portion forming the solid-state imaging device 1a are arbitrary.

The color filters 302 are disposed on a main surface of the first substrate 10 (the widest surface among a plurality of surfaces forming a surface of the substrate), and the micro lenses 301 are disposed above the color filters 302. Although there are a plurality of micro lenses 301 in FIG. 1, a reference sign of one of the micro lenses 301 is indicated as a representative thereof. Furthermore, although there are a plurality of color filters 302 in FIG. 1, a reference sign of one of the color filters 302 is indicated as a representative thereof.

Light from a subject passing through the imaging lens 400 disposed optically forward of the solid-state imaging device 1a is incident on the micro lenses 301. An image of the light passing through the imaging lens 400 is formed through the micro lenses 301. Light with wavelengths corresponding to predetermined colors is transmitted through the color filters 302. For example, red, green, and blue color filters 302 are disposed to form a Bayer array with a two-dimensional form.

The imaging lens 400 is disposed optically forward of the plurality of micro lenses 301. The imaging lens 400 has a first lens region 401 and a second lens region 402. The first lens region 401 and the second lens region 402 are symmetrical about a light axis of the imaging lens 400. For example, the first lens region 401 is a left pupil region in an exit pupil of the imaging lens 400. For example, the second lens region 402 is a right pupil region in the exit pupil of the imaging lens 400.

The first substrate 10 has a first semiconductor layer 100 and a first wiring layer 110. The first semiconductor layer 100 and the first wiring layer 110 overlap in a direction crossing the main surface (for example, a direction substantially perpendicular to the main surface) of the first substrate 10 (the widest surface among the plurality of surfaces forming the surface of the substrate). Furthermore, the first semiconductor layer 100 is in contact with the first wiring layer 110.

The first semiconductor layer 100 has first photoelectric conversion units 101. Although there are a plurality of first photoelectric conversion units 101 in FIG. 1, a reference sign of one of the first photoelectric conversion units 101 is indicated as a representative thereof. The first semiconductor layer 100 is made of a material including a semiconductor such as silicon (Si). For example, the first photoelectric conversion units 101 may be made of a semiconductor material with an impurity concentration different from that of the semiconductor material forming the first semiconductor layer 100. The first semiconductor layer 100 has a first surface and a second surface. The first surface of the first semiconductor layer 100 is in contact with the first wiring layer 110. The second surface of the first semiconductor layer 100 opposite to the first surface is in contact with color filters 302. The second surface of the first semiconductor layer 100 forms a portion of the main surface of the first substrate 10.

Each of the plurality of first photoelectric conversion units 101 corresponds to one of the plurality of micro lenses 301. In other words, one of the first photoelectric conversion units 101 corresponds to one of the micro lenses 301. First light transmitted through the plurality of micro lenses 301 is incident on the plurality of first photoelectric conversion units 101 corresponding to the plurality of micro lenses 301. The plurality of first photoelectric conversion units 101 generate first signals according to the first light.

The first wiring layer 110 has first wirings 111, first vias 112, and a first inter-layer insulating film 113. Although there are a plurality of first wirings 111 in FIG. 1, a reference sign of one of the first wirings 111 is indicated as a representative thereof. Furthermore, although there are a plurality of first vias 112 in FIG. 1, a reference sign of one of the first vias 112 is indicated as a representative thereof. The first wirings 111 are made of a material with conductivity (for example, a metal such as aluminum (Al) or copper (Cu)). The first vias 112 are made of a material with conductivity. The first wiring layer 110 has a first surface and a second surface. The first surface of the first wiring layer 110 is in contact with the second substrate 20. The second surface of the first wiring layer 110 opposite to the first surface is in contact with the first semiconductor layer 100. The first surface of the first wiring layer 110 forms a portion of the main surface of the first substrate 10.

The first wirings 111 are thin films by which wiring patterns are formed. The first wirings 111 transfer signals generated by the first photoelectric conversion units 101 and other signals (a power supply voltage, a ground voltage, and the like). The first wirings 111 with only one layer may be formed and the first wirings 111 with a plurality of layers may be formed. In an example shown in FIG. 1, four-layer first wirings 111 are formed.

The first vias 112 connect the first wirings 111 of different layers. Portions of the first wiring layer 110 other than the first wirings 111 and the first vias 112 are formed of the first inter-layer insulating film 113 made of silicon dioxide (SiO2) or the like.

The second substrate 20 has a second semiconductor layer 200 and a second wiring layer 210. The second semiconductor layer 200 and the second wiring layer 210 overlap in a direction crossing a main surface (for example, a direction substantially perpendicular to the main surface) of the second substrate 20. Furthermore, the second semiconductor layer 200 is in contact with the second wiring layer 210.

The second semiconductor layer 200 has second photoelectric conversion units 201, third photoelectric conversion units 202, and charge isolation regions 203. Although there are a plurality of second photoelectric conversion units 201 in FIG. 1, a reference sign of one of the second photoelectric conversion units 201 is indicated as a representative thereof. Furthermore, although there are a plurality of third photoelectric conversion units 202 in FIG. 1, a reference sign of one of the third photoelectric conversion units 202 is indicated as a representative thereof. Although there are a plurality of charge isolation regions 203 in FIG. 1, a reference sign of one of the charge isolation regions 203 is indicated as a representative thereof The second semiconductor layer 200 is made of a material including a semiconductor such as silicon (Si). For example, the second photoelectric conversion units 201 and the third photoelectric conversion units 202 may be made of a semiconductor material with an impurity concentration different from that of the semiconductor material forming the second semiconductor layer 200. The second photoelectric conversion units 201 and the third photoelectric conversion units 202 are disposed in regions corresponding to the first photoelectric conversion units 101. In other words, the second photoelectric conversion units 201 and the third photoelectric conversion units 202 are disposed at positions on which light transmitted through the first photoelectric conversion units 101 is incident. The second semiconductor layer 200 has a first surface and a second surface. The first surface of the second semiconductor layer 200 is in contact with the second wiring layer 210. The second surface of the second semiconductor layer 200 opposite to the first surface is in contact with the first substrate 10. The second surface of the second semiconductor layer 200 forms a portion of the main surface of the second substrate 20.

The second photoelectric conversion units 201 and the third photoelectric conversion units 202 are disposed in a direction parallel to the main surface of the second substrate 20. A plurality of pairs of photoelectric conversion units are disposed and each of the plurality of pairs of photoelectric conversion units has one of the second photoelectric conversion units 201 and one of the third photoelectric conversion units 202. Each of the plurality of pairs of photoelectric conversion units corresponds to at least one of the plurality of first photoelectric conversion units 101. In other words, one of the second photoelectric conversion units 201 and one of the third photoelectric conversion units 202 included in a pair of photoelectric conversion units correspond to at least one of the first photoelectric conversion units 101. Second light transmitted through the plurality of first photoelectric conversion units 101 is incident on the plurality of pairs of photoelectric conversion units corresponding to the plurality of first photoelectric conversion units 101. In other words, the second light transmitted through at least one of the first photoelectric conversion units 101 is incident on one of the second photoelectric conversion units 201 and one of the third photoelectric conversion units 202 included in a pair of photoelectric conversion units. The plurality of second photoelectric conversion units 201 generate second signals according to third light. The third light is the second light corresponding to light passing through the first lens region 401. The plurality of third photoelectric conversion units 202 generate third signals according to fourth light. The fourth light is the second light corresponding to light passing through the second lens region 402.

The second wiring layer 210 has second wirings 211, second vias 212, a second inter-layer insulating film 213, and the charge isolation regions 203. Although there are a plurality of second wirings 211 in FIG. 1, a reference sign of one of the second wirings 211 is indicated as a representative thereof. Furthermore, although there are a plurality of second vias 212 in FIG. 1, a reference sign of one of the plurality of second vias 212 is indicated as a representative thereof.

The second wirings 211 are made of a material with conductivity (for example, a metal such as aluminum (Al) or copper (Cu)). The second vias 212 are made of a material with conductivity. The first surface of the second wiring layer 210 forms a portion of the main surface of the second substrate 20. The second surface of the second wiring layer 210 opposite to the first surface is in contact with the second semiconductor layer 200.

The second wirings 211 are thin films by which wiring patterns are formed. The second wirings 211 transfer signals generated by the second photoelectric conversion units 201 and the third photoelectric conversion units 202 and other signals (a power supply voltage, a ground voltage, and the like). The second wirings 211 of only one layer may be formed and the second wirings 211 of a plurality of layers may be formed. In the example shown in FIG. 1, four-layer second wirings 211 are formed.

The second vias 212 connect the second wirings 211 of different layers. The second vias 212 pass through the second semiconductor layer 200 and are connected to the first vias 112. Portions of the second wiring layer 210 other than the second wirings 211, the second vias 212, and the charge isolation regions 203 are formed of the second inter-layer insulating film 213 made of silicon dioxide (SiO2) or the like.

The second substrate 20 has the charge isolation regions 203. For example, the charge isolation regions 203 are made of silicon dioxide (SiO2). The charge isolation regions 203 may be made of poly-silicon covered by silicon dioxide (SiO2). The charge isolation regions 203 may be made of a metal (copper (Cu) or the like) covered by silicon dioxide (SiO2). The charge isolation regions 203 extend over the second semiconductor layer 200 and the second wiring layer 210. The charge isolation regions 203 are disposed between the second photoelectric conversion units 201 and the third photoelectric conversion units 202. One of the charge isolation regions 203 is disposed to correspond to one of the second photoelectric conversion units 201 and one of the third photoelectric conversion units 202. The charge isolation regions 203 are configured to prevent movement of charge between the second photoelectric conversion units 201 and the third photoelectric conversion units 202. The charge isolation regions 203 further preferably shield light.

The first substrate 10 and the second substrate 20 are stacked in a state in which the first wiring layer 110 of the first substrate 10 and the second semiconductor layer 200 of the second substrate 20 face each other. The first substrate 10 and the second substrate 20 are electrically connected to each other.

The solid-state imaging device 1a can generate imaging signals from the signals generated by the first photoelectric conversion units 101. Furthermore, the solid-state imaging device 1a can generate signals (signals for calculating a phase difference) used for focus detection using phase difference AF from the signals generated by the second photoelectric conversion units 201 and the third photoelectric conversion units 202.

Figure 2:
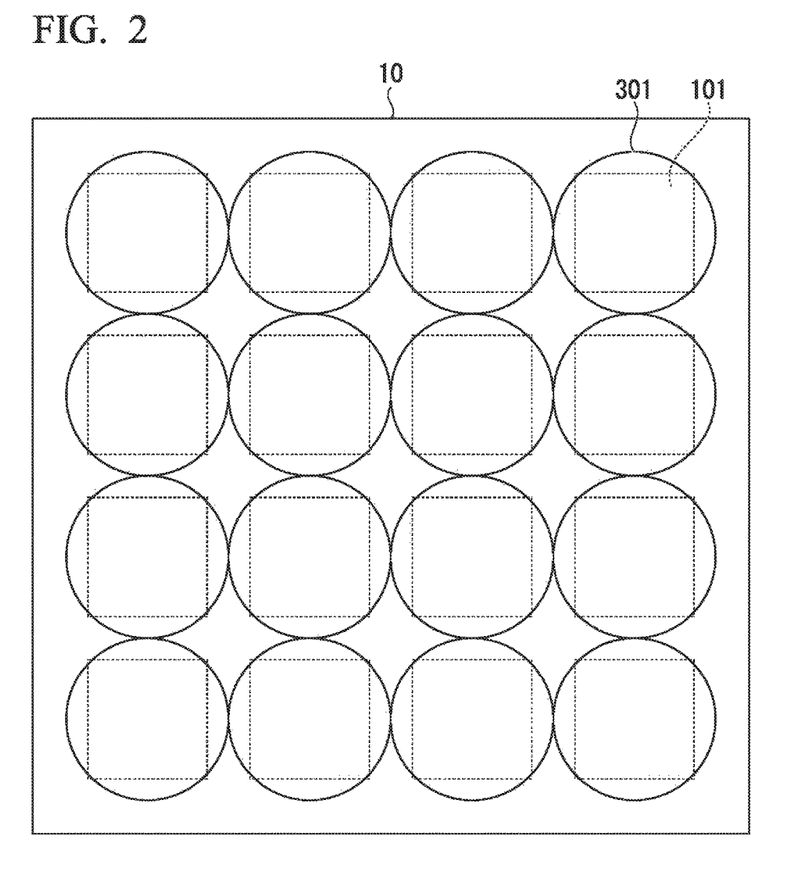
FIG. 2 is a plan view showing an array of first photoelectric conversion units in the solid-state imaging device of the first embodiment of the present invention.

FIG. 2 shows an array of the first photoelectric conversion units 101. FIG. 2 shows the array when the first substrate 10 is viewed in a direction perpendicular to the main surface of the first substrate 10. As shown in FIG. 2 the first substrate 10 has the plurality of first photoelectric conversion units 101 and the plurality of micro lenses 301. Reference signs of one of the first photoelectric conversion units 101 and one of the micro lenses 301 are indicated as representatives thereof in FIG. 2. The plurality of first photoelectric conversion units 101 and the plurality of micro lenses 301 are disposed in a matrix form. As shown in FIG. 2, one of first photoelectric conversion units 101 corresponds to one of the micro lenses 301.

Figure 3:
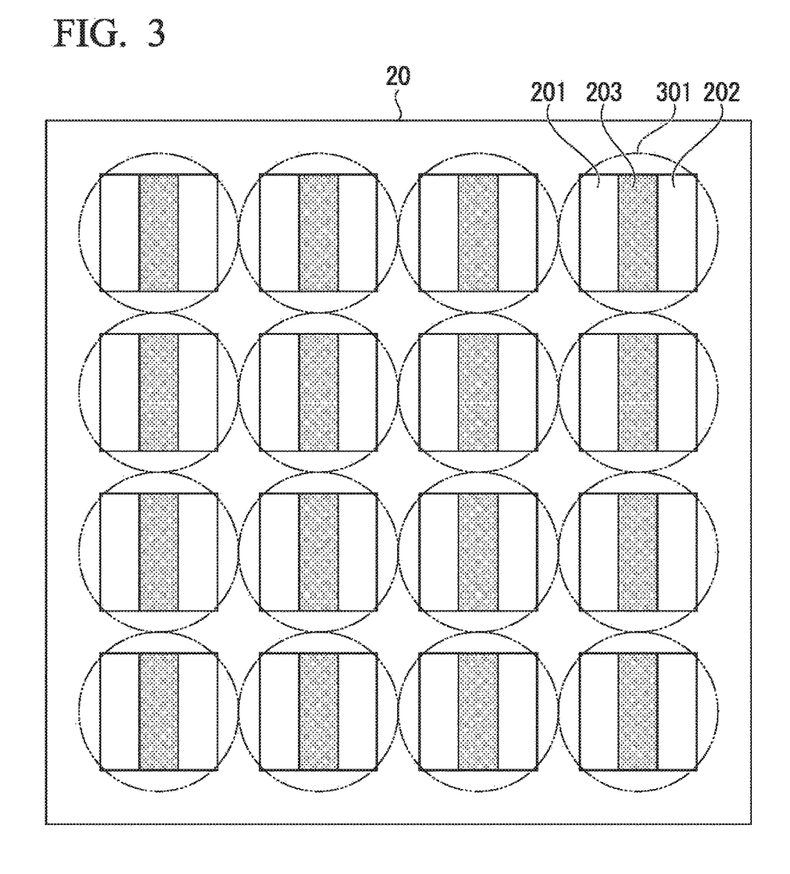
FIG. 3 is a plan view showing arrays of second photoelectric conversion units, third photoelectric conversion units, and charge isolation regions in the solid-state imaging device of the first embodiment of the present invention.

FIG. 3 shows arrays of the second photoelectric conversion units 201, the third photoelectric conversion units 202, and the charge isolation regions 203. FIG. 3 shows the arrays when the second substrate 20 is viewed in a direction perpendicular to the main surface of the second substrate 20. As shown in FIG. 3, the second substrate 20 has the plurality of second photoelectric conversion units 201, the plurality of third photoelectric conversion units 202, and the plurality of charge isolation regions 203. Reference signs of one of the second photoelectric conversion units 201, one of the third photoelectric conversion units 202, and one of the charge isolation regions 203 are indicated as representatives thereof in FIG. 3. A plurality of pairs of photoelectric conversion units of the second photoelectric conversion units 201 and the third photoelectric conversion units 202 are disposed in a matrix form. Furthermore, the plurality of charge isolation regions 203 are disposed in a matrix form.

As shown in FIG. 3, one of the second photoelectric conversion units 201, one of the third photoelectric conversion units 202, and one of the charge isolation regions 203 are disposed at a position corresponding to one of the micro lenses 301. As described above, one of the first photoelectric conversion units 101 corresponds to one of the micro lenses 301. For this reason, one of the second photoelectric conversion units 201 corresponds to one of the first photoelectric conversion units 101. Furthermore, one of the third photoelectric conversion units 202 corresponds to one of the first photoelectric conversion units 101. One of the charge isolation regions 203 corresponds to one of the first photoelectric conversion units 101.

One of the second photoelectric conversion units 201 and one of the third photoelectric conversion units 202 are disposed in regions of the second substrate 20 corresponding to one of the first photoelectric conversion units 101. Pairs of second and third signals necessary for phase difference AF are acquired by the second photoelectric conversion units 201 and the third photoelectric conversion units 202. Regions configured to acquire two signals necessary for phase difference AF in the solid-state imaging device 1000 shown in FIG. 7 correspond to two first photoelectric conversion units 801. On the other hand, regions configured to acquire two signals necessary for phase difference AF in the solid-state imaging device 1a shown in FIG. 1 correspond to one first photoelectric conversion unit 101. For this reason, in the solid-state imaging device 1a, signals necessary for phase difference AF are acquired at more positions in the second substrate 20.

Figure 4:
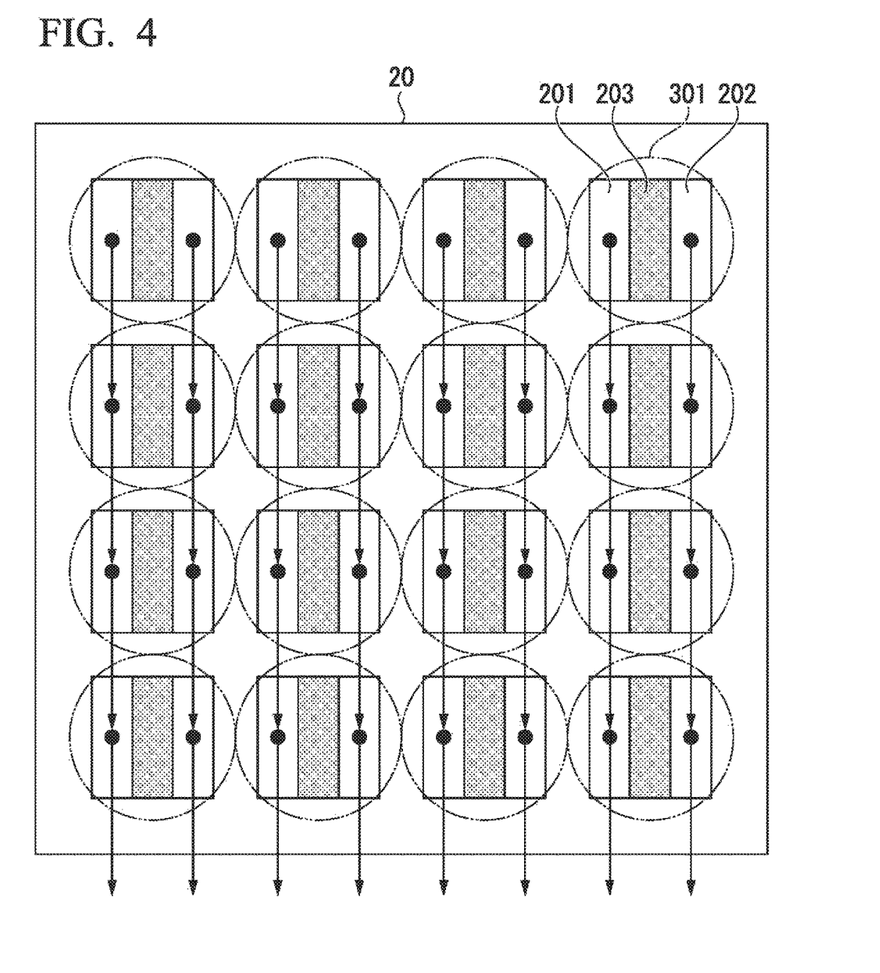
FIG. 4 is a plan view showing arrays of second photoelectric conversion units, third photoelectric conversion units, and charge isolation regions in a solid-state imaging device of the first embodiment of the present invention.

A first modified example of the first embodiment will be described. FIG. 4 shows a state similar to that of FIG. 3. A plurality of pairs of photoelectric conversion units of second photoelectric conversion units 201 and third photoelectric conversion units 202 are disposed in a matrix form. Two or more second signals generated by two or more second photoelectric conversion units 201 disposed in a direction in the arrays of the plurality of pairs of photoelectric conversion units described above are added. Furthermore, two or more third signals generated by two or more third photoelectric conversion units 202 disposed in the direction in the arrays of the plurality of pairs of photoelectric conversion units described above are added. The two or more second signals are transferred via second wirings 211 and added. Similarly, the two or more third signals are transferred via the second wirings 211 and added.

Arrows shown in FIG. 4 indicate states in which the second signals and the third signals are added. In FIG. 4, four second signals generated by four second photoelectric conversion units 201 disposed in a column direction are added. Furthermore, In FIG. 4, four third signals generated by four third photoelectric conversion units 202 disposed in the column direction are added. The summed second and third signals for every column are used for focus detection.

Figure 5:
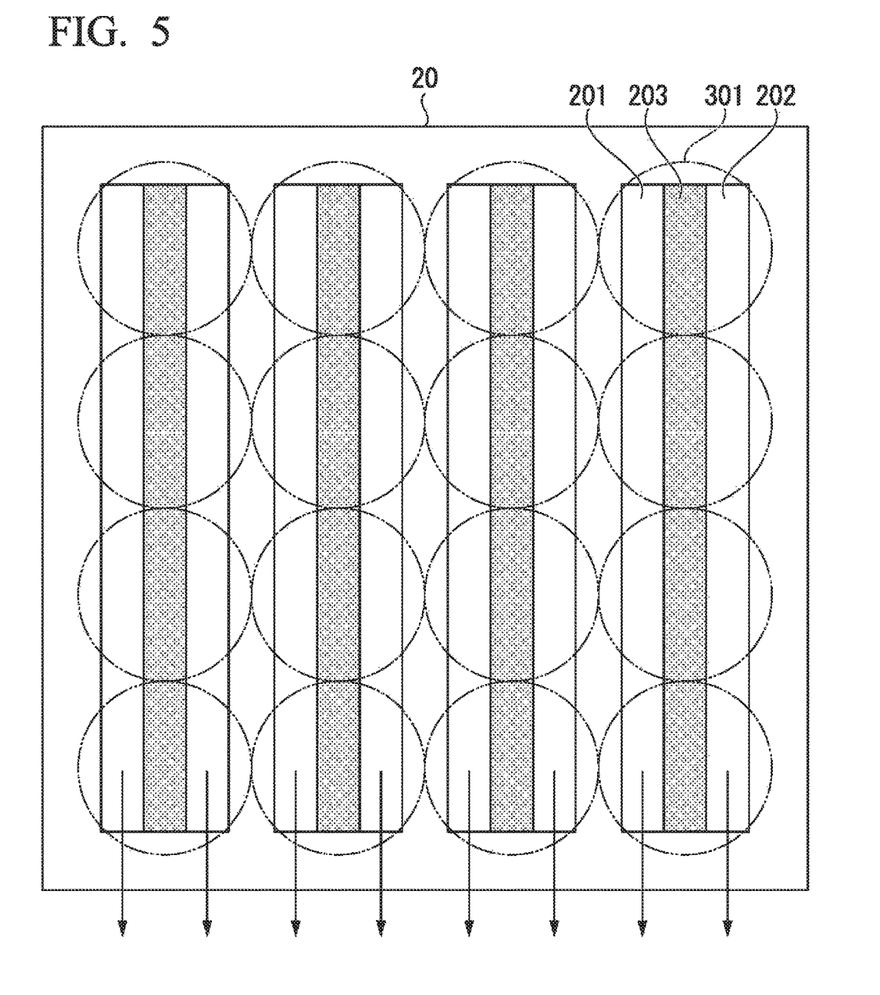
FIG. 5 is a plan view showing arrays of second photoelectric conversion units, third photoelectric conversion units, and charge isolation regions in a solid-state imaging device of the first embodiment of the present invention.

A second modified example of the first embodiment will be described. FIG. 5 shows arrays of second photoelectric conversion units 201, third photoelectric conversion units 202, and charge isolation regions 203. FIG. 5 shows the arrays when a second substrate 20 is viewed in a direction perpendicular to a main surface of the second substrate 20. As shown in FIG. 5, the second substrate 20 has the plurality of second photoelectric conversion units 201, the plurality of third photoelectric conversion units 202, and the plurality of charge isolation regions 203. Reference signs of one of the second photoelectric conversion units 201, one of the third photoelectric conversion units 202, and one of the charge isolation regions 203 are indicated as representatives thereof in FIG. 5.

A plurality of pairs of photoelectric conversion units of the second photoelectric conversion units 201 and the third photoelectric conversion units 202 each correspond to two or more first photoelectric conversion units 101. Second light transmitted through two or more first photoelectric conversion units 101 is incident on one of the second photoelectric conversion units 201 and one of the third photoelectric conversion units 202 included in a pair of photoelectric conversion units corresponding to the two or more first photoelectric conversion units 101.

In FIG. 5, one of the second photoelectric conversion units 201, one of the third photoelectric conversion units 202, one of the charge isolation regions 203, and two or more micro lenses 301 overlap when the second substrate 20 is viewed in the direction perpendicular to the main surface of the second substrate 20. As described above, one of the first photoelectric conversion units 101 corresponds to one of the micro lenses 301. For this reason, one of the second photoelectric conversion units 201 corresponds to two or more first photoelectric conversion units 101 disposed in a column direction. Furthermore, one of the third photoelectric conversion units 202 corresponds to two or more first photoelectric conversion units 101 disposed in the column direction. One of the charge isolation regions 203 corresponds to two or more first photoelectric conversion units 101 disposed in the column direction. Second signals for every column are generated by one of the second photoelectric conversion units 201. Furthermore, third signals for every column are generated by one of the third photoelectric conversion units 202.

In FIG. 5, a density of the second photoelectric conversion units 201 and the third photoelectric conversion units 202 disposed in a row direction is the same as a density of the second photoelectric conversion units 201 and the third photoelectric conversion units 202 disposed in a row direction in FIG. 4. For this reason, in the second substrate 20, signals necessary for phase difference AF are acquired at more positions in the row direction of the above-described arrays.

Solid-state imaging devices of aspects of the present invention may not have a constitution corresponding to at least one of the first wiring layer 110, the second wiring layer 210, the color filters 302, and the imaging lens 400.

According to the first embodiment, the solid-state imaging device 1a having the plurality of micro lenses 301, the first substrate 10, and the second substrate 20 is provided. The first substrate 10 has the plurality of first photoelectric conversion units 101. The second substrate 20 has the plurality of second photoelectric conversion units 201 and the plurality of third photoelectric conversion units 202.

In the first embodiment, the second substrate 20 has the plurality of second photoelectric conversion units 201 and the plurality of third photoelectric conversion units 202. The plurality of pairs of photoelectric conversion units are disposed, and one of the plurality of pairs of photoelectric conversion units includes one of the second photoelectric conversion units and one of the third photoelectric conversion units 202. Each of the plurality of pairs of photoelectric conversion units corresponds to at least one of the plurality of first photoelectric conversion units 101. For this reason, signals can be acquired at more positions.

In the solid-state imaging device 1000 shown in FIG. 7, a part of light transmitted through the first photoelectric conversion units 801 is reflected by the light shielding layers 811a. Light reflected by the light shielding layers 811a may be incident on the first photoelectric conversion units 801 of adjacent pixels. For this reason, colors are likely to be mixed. Furthermore, in first and second pixels for phase difference AF, positions at which the openings 8110 are disposed are different. For this reason, when light with uniform light intensity is incident on the solid-state imaging device 1000, intensities of light reflected by the light shielding layers 811a and incident on the plurality of first photoelectric conversion units 801 may be different in accordance with positions of the pixels for acquiring the image. As a result, a variation in signals generated by the plurality of first photoelectric conversion units 801 is likely to occur.

In the solid-state imaging device 1a shown in FIG. 1, the first wirings 111 do not include light shielding layers. Furthermore, structures of a pair of one of the second photoelectric conversion units 201, one of the third photoelectric conversion units 202, and one of the charge isolation regions 203 in the solid-state imaging device 1a are substantially the same at any position on the second substrate 20. For this reason, when light with uniform light intensity is incident on the solid-state imaging device 1 a, intensities of light incident on the plurality of first photoelectric conversion units 101 are substantially the same. As a result, a variation in the signals generated by the plurality of first photoelectric conversion units 101 is reduced.

(Second Embodiment)

Figure 6:
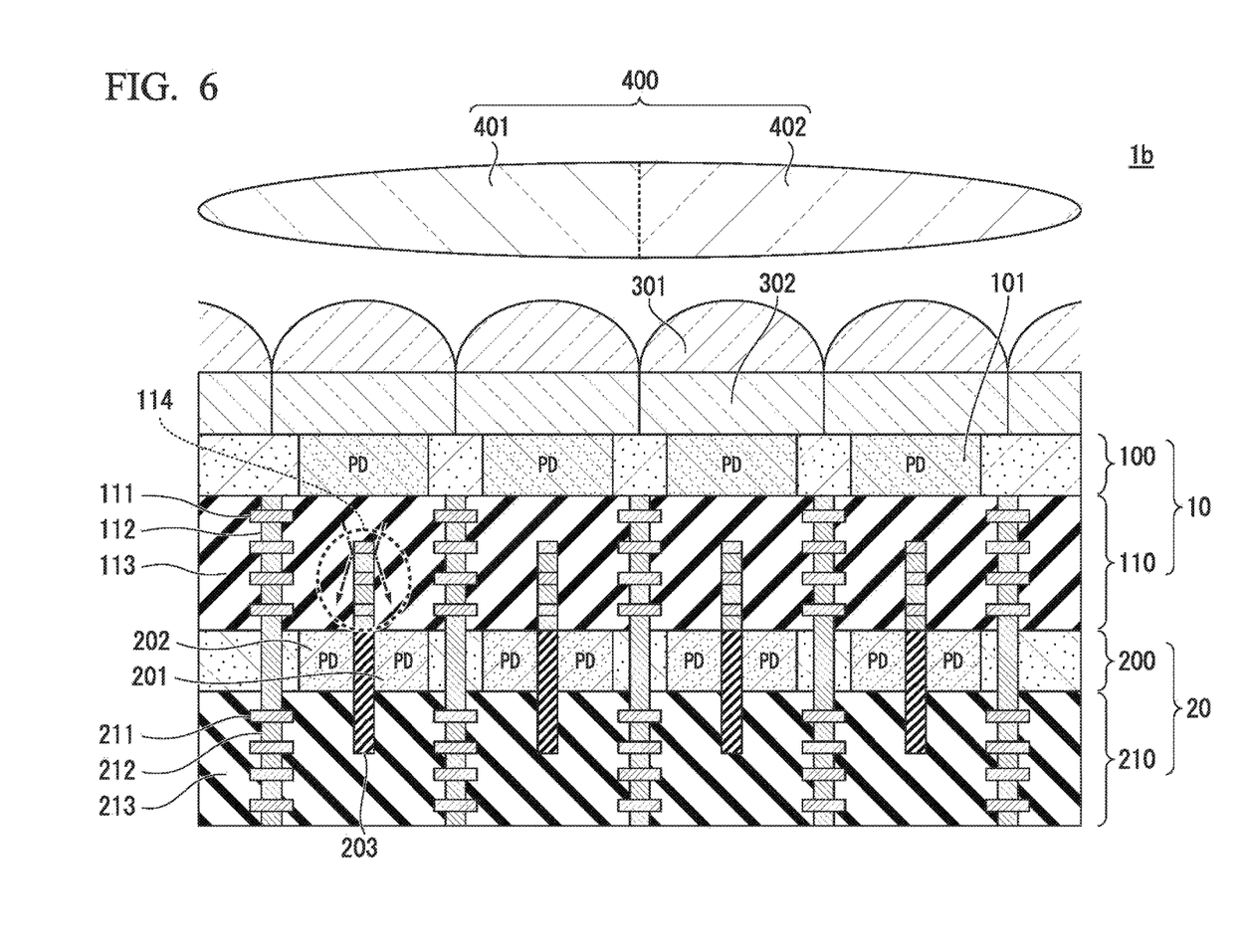
FIG. 6 is a cross-sectional view of a solid-state imaging device of a second embodiment of the present invention.

FIG. 6 shows a constitution of a solid-state imaging device 1b of a second embodiment of the present invention. FIG. 6 shows a cross section of the solid-state imaging device 1b. As shown in FIG. 6, the solid-state imaging device 1b has a first substrate 10, a second substrate 20 stacked above the first substrate 10, micro lenses 301, color filters 302, and an imaging lens 400.

A difference between a constitution shown in FIG. 6 and the constitution shown in FIG. 1 will be described. The first substrate 10 has a first wiring layer 110 and separating layers 114. The first wiring layer 110 has a plurality of first wirings 111 which are stacked. Each of the separating layers 114 has a portion of one of the plurality of first wirings 111, and the separating layers 114 and the charge isolation regions 203 are disposed to overlap each other.

In FIG. 6, the separating layers 114 are disposed in the first wiring layer 110. The separating layers 114 are constituted of three-layer first wirings 111 and vias configured to connect the first wirings 111 of different layers. The vias constituting the separating layers 114 are the same as first vias 112. The separating layers 114 are disposed between second photoelectric conversion units 201 and third photoelectric conversion units 202 when the first substrate 10 is viewed in a direction perpendicular to a main surface of the first substrate 10. The separating layers 114 have light reflection characteristics. For example, the separating layers 114 have columnar shapes.

With regard to points other than the above, the constitution shown in FIG. 6 is the same as the constitution shown in FIG. 1.

In the second embodiment, the separating layers 114 function as optical waveguides. Light is reflected by lateral walls of the separating layers 114. For this reason, the second light transmitted through the first photoelectric conversion units 101 is easily separated into the third light and the fourth light. The third light corresponds to light passing through the first lens region 401 of the imaging lens 400. The fourth light corresponds to light passing through the second lens region 402 of the imaging lens 400. As a result, light is efficiently incident on the second photoelectric conversion units 201 and the third photoelectric conversion units 202.

When the charge isolation regions 203 are made of only silicon dioxide (SiO2) or when the charge isolation regions 203 are made of silicon dioxide (SiO2) and poly-silicon, light is likely to be transmitted through the charge isolation regions 203. The separating layers 114 are provided so that a direction of light incident on the second photoelectric conversion units 201 or the third photoelectric conversion units 202 does not easily change into direction crossing the charge isolation regions 203. For this reason, light does not easily transmit through the charge isolation regions 203.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device, comprising:
a plurality of micro lenses;
a first substrate which has a plurality of first photoelectric conversion units, in which each of the plurality of first photoelectric conversion units corresponds to any one of the plurality of micro lenses, in which first light transmitted through the plurality of micro lenses is incident on the plurality of first photoelectric conversion units corresponding to the plurality of micro lenses, and in which the plurality of first photoelectric conversion units generate first signals according to the first light;
a second substrate which has a plurality of second photoelectric conversion units and a plurality of third photoelectric conversion units, in which a plurality of pairs of photoelectric conversion units are disposed, in which each of the plurality of pairs of photoelectric conversion units includes one of the second photoelectric conversion units and one of the third photoelectric conversion units, in which each of the plurality of pairs of photoelectric conversion units corresponds to at least one of the plurality of first photoelectric conversion units, in which second light transmitted through the plurality of first photoelectric conversion units is incident on the plurality of pairs of photoelectric conversion units corresponding to the plurality of first photoelectric conversion units, in which the plurality of second photoelectric conversion units generate second signals according to third light, in which the third light is the second light corresponding to light passing through a first lens region, in which the plurality of third photoelectric conversion units generate third signals according to fourth light, and in which the fourth light is the second light corresponding to light passing through a second lens region,
wherein an imaging lens is disposed optically forward of the plurality of micro lenses and the imaging lens has the first lens region and the second lens region,
the second substrate further includes charge isolation regions disposed between the second photoelectric conversion units and the third photoelectric conversion units and the charge isolation regions are configured to prevent movement of charge between the second photoelectric conversion units and the third photoelectric conversion units, and
the first substrate further includes pillar-shaped separating layers formed so as to extend in the direction from the charge isolation regions to the first photoelectric conversion units, the separating layers configured to separate the second light into the third light and the fourth light and to cause the third light and the fourth light to be incident on the second photoelectric conversion units and the third photoelectric conversion units respectively.

2. The solid-state imaging device according to claim 1, wherein the first substrate further includes
a wiring layer having a plurality of wirings which are stacked and the separating layers have some of the plurality of wirings and are disposed such that the separating layers and the charge isolation regions overlap.

3. The solid-state imaging device according to claim 1, wherein the plurality of pairs of photoelectric conversion units are disposed in a matrix form, and two or more second signals generated by two or more second photoelectric conversion units disposed in a direction in an array of the plurality of pairs of photoelectric conversion units are added and two or more third signals generated by two or more third photoelectric conversion units disposed in the direction are added.

4. The solid-state imaging device according to claim 1, wherein each of the plurality of pairs of photoelectric conversion units corresponds to two or more first photoelectric conversion units, and the second light transmitted through two or more first photoelectric conversion units is incident on one of the second photoelectric conversion units and one of the third photoelectric conversion units included in a pair of photoelectric conversion units corresponding to the two or more first photoelectric conversion units.

5. The solid-state imaging device according to claim 1, wherein the separating layers have light reflection characteristics.

* * * * *